United States Patent
Kondo

(10) Patent No.: US 6,768,061 B2
(45) Date of Patent: Jul. 27, 2004

(54) MULTILAYER CIRCUIT BOARD

(75) Inventor: Koji Kondo, Toyohashi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/179,203

(22) Filed: Jun. 26, 2002

(65) Prior Publication Data

US 2003/0007330 A1 Jan. 9, 2003

(30) Foreign Application Priority Data

Jul. 6, 2001 (JP) .......................... 2001-206889

(51) Int. Cl.⁷ .............................................. H05K 1/03
(52) U.S. Cl. ................ 174/255; 174/256; 174/262; 174/264; 361/697; 361/767; 361/792; 361/795
(58) Field of Search .................... 174/256, 255, 174/260, 262, 264, 252, 261, 258, 263, 254; 361/760, 792, 793, 794, 795, 688, 697, 767, 771, 774

(56) References Cited

U.S. PATENT DOCUMENTS

| | | | | |
|---|---|---|---|---|
| 4,897,338 A | * | 1/1990 | Spicciati et al. ............ | 430/314 |
| 5,158,801 A | * | 10/1992 | Hopson et al. ............... | 427/58 |
| 5,200,579 A | * | 4/1993 | Takeuchi .................... | 174/256 |
| 5,386,339 A | * | 1/1995 | Polinski, Sr. ............... | 361/719 |
| 5,478,972 A | * | 12/1995 | Mizutani et al. ............ | 174/250 |
| 5,549,778 A | | 8/1996 | Yokoyama et al. | |
| 5,621,068 A | * | 4/1997 | Okamoto et al. ........... | 528/353 |
| 5,747,164 A | * | 5/1998 | Miyakawa et al. ...... | 428/411.1 |
| 6,441,314 B2 | * | 8/2002 | Rokugawa et al. ......... | 174/255 |
| 6,534,723 B1 | * | 3/2003 | Asai et al. ................... | 174/255 |
| 6,555,763 B1 | * | 4/2003 | Hirasawa et al. ........... | 174/264 |

FOREIGN PATENT DOCUMENTS

| | | |
|---|---|---|
| JP | A-6-232558 | 8/1994 |
| JP | A-8-148828 | 6/1996 |
| JP | 409036553 A * | 2/1997 |
| JP | 410199882 A * | 7/1998 |
| JP | A-11-284342 | 10/1999 |
| JP | A-11-312868 | 11/1999 |
| JP | A-2000-294929 | 10/2000 |

* cited by examiner

*Primary Examiner*—Kamand Cuneo
*Assistant Examiner*—I B Patel
(74) *Attorney, Agent, or Firm*—Posz & Bethards, PLC

(57) ABSTRACT

A multilayer circuit board that has electrodes only on one surface is manufactured as follows. A plurality of conductor layers are formed on a resin film made of thermoplastic resin to form a single-sided conductor layer film. Then, a plurality of via-holes 24, which are bottomed by the conductor layers, are formed in the resin film. Then interlayer connecting material is packed in the via-holes 24 to form a single-sided conductor layer film having the interlayer connecting material. A plurality of single-sided conductor layer films are formed and stacked such that surfaces having the conductor layers face in the same direction. Then, the single-sided conductor layer films are pressed and heated to complete the multilayer circuit board. The multilayer circuit board is formed by using only the single-sided conductor layer films and pressing once, so the manufacturing process is simplified.

14 Claims, 2 Drawing Sheets

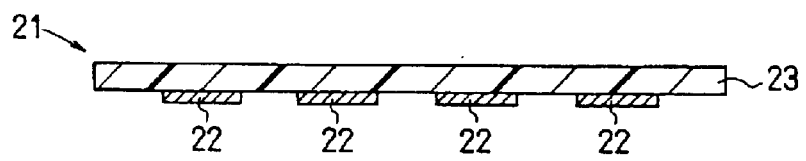
FIG. 1A
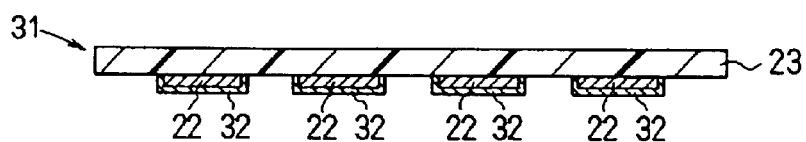
FIG. 1B
FIG. 1C
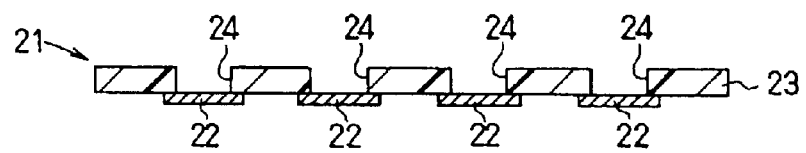
FIG. 1D
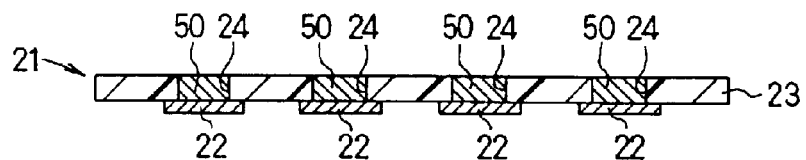
FIG. 1E
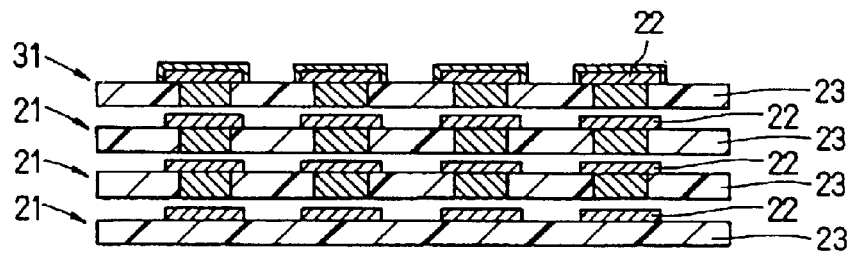
FIG. 1F
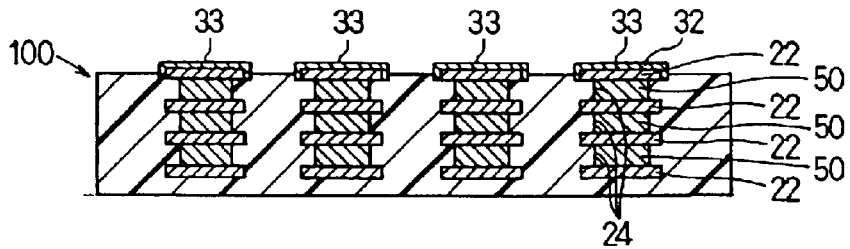

MULTILAYER CIRCUIT BOARD

CROSS REFERENCE TO RELATED APPLICATION

This application is based on and incorporates herein by reference Japanese Patent Application No. 2001-206889 filed on Jul. 6, 2001.

BACKGROUND OF THE INVENTION

The present invention relates to a multilayer circuit board and a method for manufacturing the multilayer circuit board, especially relates to a multilayer circuit board that has electrodes, which are used for the connection with a chip component, only on one surface of the board and to a method for manufacturing the multilayer circuit board.

A conventionally known multilayer circuit board of the same type is manufactured using a plurality of so-called double-sided boards as follows. Each double-sided board includes a thermosetting resin film and a plurality of conductor layers, which are located on two surfaces of the thermosetting resin film. The conductor layers on one surface are electrically connected to the conductor layers on the other surface. The plurality of double-sided boards are piled with a plurality of interconnecting boards, which include unset thermosetting resin films in B stage and are ready for electrically connecting the conductor layers, such that the interconnecting boards are interleaved with the double-sided boards. At the same time, an unset thermosetting resin film is piled to cover one surface, to which the chip component is not connected, of the piled body, which includes the interconnecting boards and the double-sided boards. Then, the piled body, which includes the interconnecting boards, the double-sided boards, and the unset thermosetting resin film, is pressed and heated to complete the conventionally known multilayer circuit board.

Another conventionally known multilayer circuit board is manufactured as follows. An interconnecting board and a conductive foil are piled in this order on each surface of a double-sided board. After the piled body, which includes the double-sided board, the interconnecting boards, and the conductive foils, is pressed and heated, the conductive foils formed on both surfaces of the double-sided board are shaped by etching. An intermediate multilayer circuit board having the predetermined number of layers is formed by repeating a series of the piling, pressing, heating, and etching steps. After an unset thermosetting resin film is piled with the intermediate multilayer circuit board to cover one surface of the board, the piled body, which includes the intermediate multilayer circuit board and the unset thermosetting resin film, is pressed and heated to complete the another conventionally known multilayer circuit board.

In the methods for manufacturing conventionally known multilayer circuit boards described above, after a plurality of double-sided boards and a plurality of interconnecting boards are formed separately, the two are combined together, or after one double-sided board and a plurality of interconnecting boards are formed separately, they are combined with the conductive foils and. Therefore, the manufacturing process is relatively complicated.

SUMMARY OF THE INVENTION

The present invention has been made in view of the above aspects with an object to provide a multilayer circuit board, the manufacturing process of which can be simplified even if the multilayer circuit board has electrodes used for connection with a chip component only on one surface of the board, and to provide a method for manufacturing the multilayer circuit board.

A plurality of conductor layers are formed on a resin film made of thermoplastic resin to form a single-sided conductor layer film. Then, a plurality of via-holes, which are bottomed by the conductor layers, are formed in the single-sided conductor layer film. Then an interlayer connecting material is packed in the via-holes to form a single-sided conductor layer film having the interlayer connecting material. A plurality of single-sided conductor layer films are formed and stacked such that surfaces having the conductor layers face in the same direction. Then, the single-sided conductor layer films are pressed and heated to complete the multilayer circuit board, which has electrodes only on one surface. The multilayer circuit board is formed by using only the single-sided conductor layer films and pressing once, so the manufacturing process is simplified.

BRIEF DESCRIPTION OF THE DRAWINGS

The above and other objects, features and advantages of the present invention will become more apparent from the following detailed description made with reference to the accompanying drawings. In the drawings:

FIGS. 1A to 1F are step-by-step cross-sectional views showing the summarized production process of a multilayer circuit board according to the first embodiment of the present invention.

DETAILED DESCRIPTION OF THE PREFERRED EMBODIMENTS

Figure 2A:
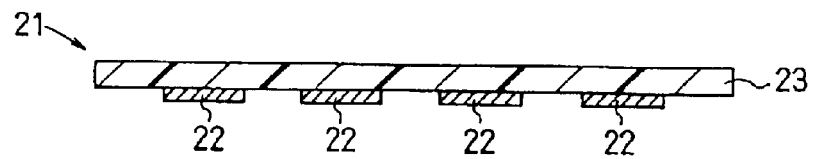
FIGS. 2A to 2F are step-by-step cross-sectional views showing the summarized production process of a multilayer circuit board according to the second embodiment of the present invention.
Figure 2B:
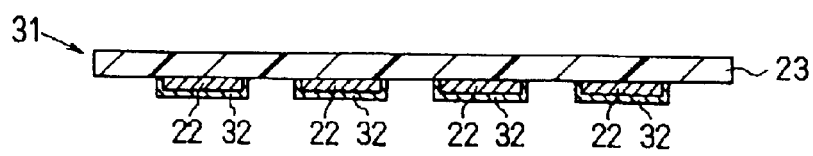
Figure 2C:
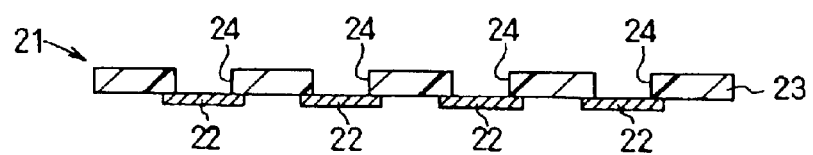
Figure 2D:
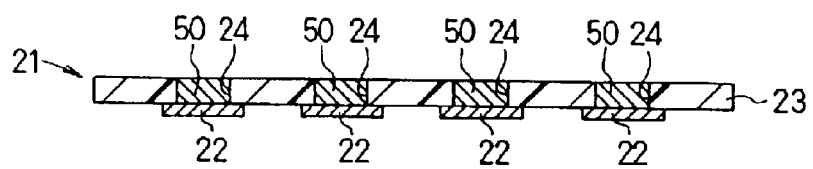

The present invention will be described in detail with reference to various embodiments.

First Embodiment

As shown in FIG. 1A, a single-sided conductor layer film 21 has conductor layers 22, which are shaped by etching a conductive foil (a copper foil with a nominal thickness of 18 micrometers in this embodiment) adhered onto one side of a resin film 23. In FIG. 1A, a thermoplastic film with a thickness of 25–75 micrometers, which is made of a mixture of 65–35 weight % polyetheretherketone resin and 35–65 weight % polyetherimide resin, is used as the resin film 23.

After the conductor layers 22 are formed as shown in FIG. 1A, to form a single-sided conductor layer film 31 having electrodes 33, which is described later, a single-sided conductor layer film 21 is immersed in plating solutions for so-called nickel-gold plating. Surfaces of the conductor layers 22 are plated with nickel and gold, and as shown in FIG. 1B, processed surface layers 32 are formed on the surfaces of the conductor layers 22. The processed surface layers 32 are formed for the purpose of improving the adhesion with a bonding material such as solder when a chip component is connected to the electrodes 33 by the bonding material.

After the conductor layers 22 are formed as shown in FIG. 1A, via-holes 24, which are bottomed by the conductor layers 22, are formed in the single-sided conductor layer film 21 by irradiating with carbon dioxide laser from the side of the resin film 23, as shown in FIG. 1C. When the via-holes 24 is formed, the conductor layers 22 escape being dug by adjusting the power and the exposure time period of the carbon dioxide laser. Other than the carbon dioxide laser, excimer laser and so on may be used for forming the via-holes 24. Other than laser, via-hole formation means such as drilling is applicable. However, if holes are machined by laser beam, it is possible to form holes with a fine diameter and the conductor layers 22 incur less damage, so laser beam is preferred.

After the via-hole 24 are formed as shown in FIG. 1C, then, conductive paste 50 (interlayer connecting material), which is a material for electric connection, is packed in the via-holes 24, as shown in FIG. 1D. The conductive paste 50 is prepared as follows. An organic solvent and binder resin are added to metal particles made of copper, silver, tin, and so on. The mixture is compounded by a mixer to make it pasty. The conductive paste 50 is printed and packed in the via-holes 24 by a screen-printing machine. Instead of the method using the screen-printing machine, other methods using a dispenser and so on may be used as long as the conductive paste 50 is surely packed in the via-holes 24. Although not illustrated, with respect to the single-sided conductor layer film 31 shown in FIG. 1B, the via-holes 24 are formed and the conductive paste 50 is packed by the same steps as in FIGS. 1C and 1D.

After the conductive paste 50 is packed in the via-holes 24 of the single-sided conductor layer films 21, 31, as viewed in FIG. 1E, a plurality of single-sided conductor layer films 21 (three films in FIG. 1E) are stacked such that the surfaces having the conductor layers 22 face upward. On top of the stacked single-sided conductor layer films 21, the single-sided conductor layer film 31, which includes the electrodes 33, is stacked such that the surface having the electrodes 33 faces upward. No via-holes are formed in the single-sided conductor layer film 21 that is located at the lowest position in FIG. 1E.

After the single-sided conductor layer films 21, 31 are stacked to form a stacked body as shown in FIG. 1E, the stacked body in FIG. 1E is pressed and heated from the top and the bottom surfaces of the stacked body by a vacuum hot-press machine. Specifically, the stacked body in FIG. 1E is pressed under a pressure of 1–10 MPa while being heated at a temperature of 250–350° C. to bond the single-sided conductor layer films 21, 31 and to form an integrated body, as shown in FIG. 1F. All the resin films 23 are made of the same thermoplastic resin and the modulus of elasticity of the resin films 23 is reduced to about 5–40 MPa when being pressed and heated by the vacuum hot-press machine, so the resin films 23 are readily heat-sealed and integrated, as shown in FIG. 1F. Moreover, the surface activities of the conductor layers 22 and the conductive paste 50 in the via-holes 24 are increased by being heated above 250° C., so the conductor layers 22 and the conductive paste 50 are connected and a plurality of pairs of conductor layers 22, which are separated by the resin films 23, are electrically connected by the conductive paste 50. With above steps, a multilayer circuit board 100, which includes the electrodes 33 only on one surface of the board 100, is manufactured.

In the method according to the first embodiment, the modulus of elasticity of the resin films 23 while being pressed and heated is preferably 1–1000 MPa. If the modulus of elasticity is greater than 1000 MPa, it is difficult to heat-seal the resin films 23 and the conductor layers 22 are readily broken by excessive stress that the conductor layers 22 incur while being pressed and heated. On the other hand, if the modulus of elasticity is smaller than 1 MPa, the resin films 23 flow readily and the conductor layers 22 are drifted too readily to form the multilayer circuit board 100.

In the method according to the first embodiment, the multilayer circuit board 100 is manufactured using only the single-sided conductor layer films 21, 31, so the manufacturing process can be simplified. Moreover, the single-sided conductor layer films 21, 31 are bonded together at one time by being pressed and heated once. Therefore, it is possible to shorten the lead time in the manufacturing process and simplify further the manufacturing process. In addition, the surface, to which the chip component is not connected, of the multilayer circuit board 100 is insulated by the resin film 23 of the single-sided conductor layer film 21 that is located at the lowest position as viewed in FIG. 1E. Therefore, no dedicated insulating layer made of a film and so on is needed.

Second Embodiment

Using steps shown in FIGS. 2A–2D, which are the same steps as those shown in FIGS. 1A–1D in the first embodiment, the conductor layers 22 are formed on the resin films 23, the processed surface layers 32 and the via-holes 24 are formed in the resin films 23, and the conductive paste 50 is packed in the via-holes 24. A plurality of single-sided conductor layer films 21a are formed using the same steps as for the single-sided conductor layer films 21. Each single-sided conductor layer film 21a includes a plurality of thermal vias 44, which are made of via-holes 24a and the conductive paste 50, which is packed in the via-holes 24a.

Figure 2E:
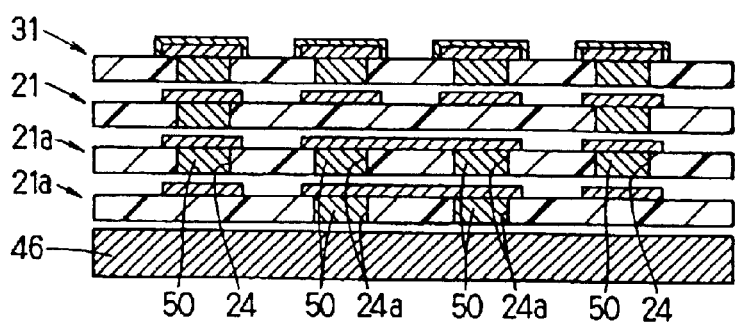

After the conductive paste 50 is packed in the via-holes 24, 24a of the single-sided conductor layer films 21, 21a, 31, as shown in FIG. 2E, a plurality of single-sided conductor layer films 21, 21a (three films in this embodiment) are stacked such that the surfaces having the conductor layers 22 face upward. On top of the stacked single-sided conductor layer films 21, 21a, the single-sided conductor layer film 31, which includes the electrodes 33, is stacked such that the surface having the electrodes 33 faces upward.

As viewed in FIG. 2E, a heat sink 46 made of aluminum alloy is placed under the stacked body that includes single-sided conductor layer films 21, 21a, 31. The heat sink 46 is a heat releasing member and has a roughened surface at the upper side of the heat sink 46 in FIG. 2E for the purpose of improving the adhesion, which is described later, when being bonded to the single-sided conductor layer film 21a. As a method for forming the roughened surface, buffing, shot blasting, anodic oxide coating, and so on may be employed.

Figure 2F:
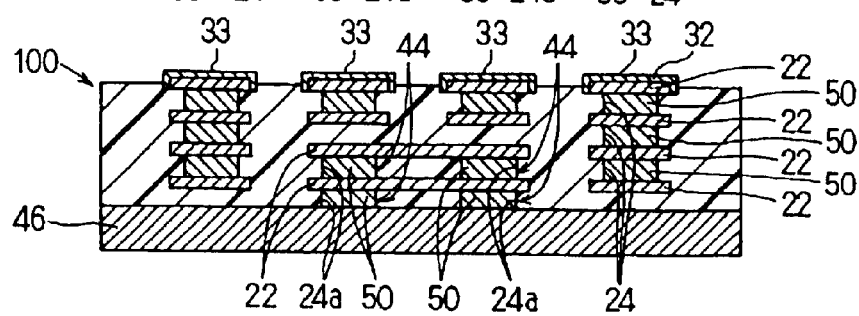

After the stacked body and the heat sink 46 are stacked as shown in FIG. 2E, the stacked body and the heat sink 46 are pressed and heated by the vacuum hot-press machine. By being pressed and heated, the single-sided conductor layer films 21, 21a, 31 and the heat sink 46 are bonded together, and an integrated body is formed, as shown in FIG. 2F. The resin films 23 are heat-sealed and integrated, and at the same time a plurality of pairs of conductor layers 22, which are separated by the resin films 23, are electrically connected by the conductive paste 50 in the via-holes 24, 24a, and a multilayer circuit board 100, which includes the electrodes 33 only on one surface of the board 100, is manufactured. As viewed in FIG. 2F, the heat sink 46 is located on the bottom surface of the board 100, and the bottom surface faces in the direction opposite to the one in which the top surface having the electrodes 33 faces.

In FIG. 2E, the via-holes 24a are located at the central areas of two single-sided conductor layer films 21a. The conductive paste 50 packed in the via-holes 24a of the two single-sided conductor layer films 21a are directly or indirectly connected to the heat sink 46, as shown in FIG. 2F.

Specifically, the conductive paste 50 of one single-sided conductor layer film 21a to which the heat sink 46 is connected is directly connected to the heat sink 46 and connects the heat sink 46 and the conductor layers 22 of the one single-sided conductor layer film 21a is connected. The conductive paste 50 of the other single-sided conductor layer film 21a connects the conductor layers 22 of the one single-sided conductor layer film 21a and the conductor layers 22 of the other single-sided conductor layer film 21a.

As shown in FIG. 2F, via-holes 24a and the conductive paste 50 packed in the via-holes 24a of the two single-sided conductor layer films 21a make up thermal vias 44. A plurality of thermal vias 44 are formed for releasing heat from the integrated single-sided conductor layer films 21, 21a, 31 to the heat sink 46. In the method according to the second embodiment, the thermal vias 44 and the conductor layers 22 connected to the thermal vias 44 in FIG. 2F are electrically insulated from other conductor layers 22 that make up an electric circuit in the multilayer circuit board 100. The conductive paste 50 of the thermal vias 44 is formed only for the thermal conduction to the heat sink 46. The electric circuit of the multilayer circuit board 100 is insulated at the surface having the heat sink 46.

The via-holes 24a of the thermal vias 44 are formed to have the same diameter (nominally 100 micrometers in FIGS. 2E and 2F) as other via-holes 24. The thermal conductivity of the thermal vias 44 can be improved by increasing the diameter of the via-holes 24a of the thermal vias 44 and the connecting material 50 packed in the via-holes 24a. However, the adhesion between the multilayer circuit board 100 and the heat sink 46 extremely decreases at the positions where the thermal vias 44 are formed. On the other hand, if the number of the thermal vias 44 is increased without increasing the diameter to improve the thermal conductivity, the adhesion between the multilayer circuit board 100 and the heat sink 46 can be prevented from decreasing.

The resin films 23 are made of the same thermoplastic resin, and the modulus of elasticity of the resin films 23 is reduced to about 5–40 MPa when being pressed and heated by the vacuum hot-press machine. In addition, the surface activities of the conductor layers 22, the conductive paste 50, and the heat sink 46 are increased by being heated above 250° C. Therefore, the resin films 23 can be surely bonded to each other, and the conductor layers 22, the conductive paste 50, and the heat sink 46 can be surely connected to each other. The modulus of elasticity of the resin films 23 while being pressed and heated is preferably 1–1000 MPa because of the same reasons as described in the first embodiment.

In the method according to the second embodiment, the multilayer circuit board 100 is formed using only the single-sided conductor layer films 21, 21a, 31, so the manufacturing process can be simplified. Moreover, the single-sided conductor layer films 21, 21a, 31 are bonded together at one time by being pressed and heated once, at the same time, the heat sink 46 is connected to the multilayer circuit board 100, and the thermal vias 44 are connected to the heat sink 46. Therefore, it is possible to shorten the lead time in the manufacturing process and simplify further the manufacturing process The heat sink 46 is vulnerable to damage from the plating solutions for plating nickel and gold on the conductor layers 22 to form the electrodes 33. Therefore, the heat sink 46 needs to be protected by coating resin and so on if the heat sink 46 has to be immersed in the plating solutions to form the processed surface layers 32 on the conductive layers 22. However, in the method according to the second embodiment, the processed surface layers 32 are formed before the single-sided conductor layer film 21, 21a, 31, and the heat sink 46 are stacked. Therefore, there is no need to protect the heat sink 46.

Modifications

For the multilayer circuit boards 100 according to the first and second embodiments, the resin films made of a mixture of 65–35 weight % polyetheretherketone resin and 35–65 weight % polyetherimide resin are used for the resin films 23. Not being limited to the resin films, it is possible to use other resin films made by adding nonconductive filler to polyetheretherketone resin and polyetherimide resin. It is also possible to use separately polyetheretherketone or polyetherimide.

Moreover, thermoplastic resins such as thermoplastic polyimide or what is called liquid crystal polymer are usable as well. As long as a resin film has a modulus of elasticity of 1–1000 MPa at the heating temperature while the single-sided conductor layer films 21, 21a, 31 are pressed and heated and has thermal resistance needed at the later soldering step and so on, the resin film is preferably used.

In the multilayer circuit boards 100 according to the first and second embodiments, the processed surface layers 32 are located only on the conductor layers 22 of one single-sided conductor layer film 31, as shown in FIGS. 1F and 2F. However, they may be located on the conductor layers 22 of other single-sided conductor layer films 21, 21a. Instead of the nickel-gold plating, which is applied to the conductor layers 22 to form the electrodes 33 and improve the adhesion of the bonding material that is used when the chip component is connected, heat-stable prefluxing, palladium plating and soon may be applied. If sufficient adhesion is provided without the processed surface layers 32, there is no need to from the processed surface layers 32.

In the multilayer circuit board 100 according to the second embodiment, the heat sink 46 is made of aluminum alloy. However, it may be made of other metals or ceramics. Although the thermal vias 44 are formed only in two single-sided conductor layer films 21a in FIG. 2E, there are other variations. For example, the thermal vias 44 may be formed in four single-sided conductor layer films 21a such that the thermal vias 44 are connected together to reach the top surface on which the electrodes 33 are formed to relatively efficiently release heat in the chip component connected to the electrodes 33 to the heat sink 46. Not being electrically insulated from the conductor layers 22 that make up the electric circuit in the multilayer circuit board 100, the thermal vias 44 may function as a part of the electric circuit. For example, in the case that the heat sink 46 is made of copper alloy and has ground potential, the thermal vias 44 may function as a wiring that electrically connects the electric circuit to the heat sink 46 to earth the electric circuit.

In the case that the heat sink 46 is an insulator made of a material such as ceramics, even if the thermal vias 46 are electrically connected to the electric circuit, the electric circuit can be insulated by the heat sink 46 while desired heat releasing characteristics are assured. Although the heat sink 46 is directly connected to the single-sided conductor layer films 21a in the multilayer circuit board 100, a so-called bonding sheet such as a polyetherimide sheet, a thermosetting resin sheet containing heat conductive filler, or a thermoplastic resin sheet containing heat conductive filler may be formed on the surface of the heat sink 46, at which the heat sink 46 is adhered to the single-sided conductor layer films 21a, in order to improve adhesion or heat conductivity. However, in the case that the heat sink 46 functions as a part of the electric circuit in combination with the thermal vias 44, the bonding sheet needs to be removed at the positions where the thermal vias 44 contact the heat sink 46.

The multilayer circuit boards 100 according to the first and second embodiments include four single-sided conductor layer films 21, 21a, 31. However, as a matter of course, the total number of the single-sided conductor layer films 21, 21a, 31 is not limited.

What is claimed is:

1. A multilayer circuit board comprising an integrated body including a plurality of single-sided conductor layer films, wherein each single-sided conductor layer film includes:

a resin film made of thermoplastic resin; and
   a plurality of conductor layers, which are located only on one surface of the resin film, wherein at least one of the single-sided conductor layer films includes:
      a plurality of via-holes; and
      an interlayer connecting material, which is located in the via-holes and is in contact with the conductor layers, wherein:
         the surfaces on which the conductor layers are located face substantially in the same direction;
         one of the single-sided conductor layer films includes a plurality of electrodes, which are located on only one surface of the integrated body;
         the resin films are directly bonded to form the integrated body; and
         all of the resin films are made of the same material.

2. The multilayer circuit board in claim 1, wherein each electrode includes a processed surface layer for improving adhesion between the electrodes and a bonding material, which is used for bonding a chip component to the electrodes.

3. The multilayer circuit board in claim 1 including a heat releasing member, which is in contact with a surface of the integrated body, wherein the direction in which the conductor layers face is a first direction, and the surface that is in contact with the heat releasing member faces a second direction, which is opposite to the first direction.

4. The multilayer circuit board in claim 3, wherein the heat releasing member is in contact with one of the single-sided conductor layer films, and the one single-sided conductor layer film that is in contact with the heat releasing member includes interlayer connecting material that is in contact with the heat releasing member, and heat is transferred from the integrated body to the heat releasing member through the interlayer connecting material that is in contact with the heat releasing member.

5. The multilayer circuit board in claim 4, wherein the interlayer connecting material of the one single-sided conductor layer film is electrically insulated from certain ones of the conductor layers that make up an electric circuit in the integrated body.

6. The multilayer circuit board in claim 4, wherein the interlayer connecting material is electrically in contact with certain ones of the conductor layers, which make up an electric circuit in the integrated body.

7. A multi-layer circuit board comprising:

an integrated thermoplastic resin body comprising a thermoplastic resin and formed in a shape of a circuit board;
   a plurality of conductors including:
      a plurality of surface conductors located on a first side surface of the integrated thermoplastic resin body;
      a plurality of embedded conductors embedded in the integrated thermoplastic resin body in a multi-layered fashion to define a plurality of resin layers in the integrated thermoplastic resin body, the surface conductors providing electrodes; and
      a plurality of interlayer connecting members made of conductive material filled in via-holes formed in the resin layers and defined in the integrated thermoplastic resin body to connect the conductors in different layers, wherein:
         the integrated thermoplastic resin body is uniformly integrated throughout all of the resin layers defined therein;
         the electrodes are exclusively located on the first side surface of the integrated thermoplastic resin body; and
         all of the resin layers are made of the same material.

8. The multi-layer circuit board in claim 7, wherein the resin layer on a second side surface, on which no electrode is located, has no via-hole, and the via-holes are in the remaining resin layers.

9. The multi-layer circuit board in claim 7, wherein each of the embedded conductors has a first surface adhered to one of the resin layers and a second surface bonded to another one of the resin layers, and bonding between the second surface and the other resin layer is achieved by pressing and heating.

10. The multi-layer circuit board in claim 7, further comprising:

a heat sink bonded to the integrated thermoplastic resin body and located on a side surface that is opposite to the electrodes; and
    a thermal via formed in the resin layer adjacent to the heat sink, the thermal via being formed with conductive material filled in a via-bole formed in the resin layer, and the thermal via thermally connecting the heat sink and one of the embedded conductors that is electrically isolated from an electric circuit formed in the integrated thermoplastic resin body.

11. The multi-layer circuit board in claim 7, further comprising:

a heat sink bonded to the integrated thermoplastic resin body and located on a side surface that is opposite to the electrodes; and
    a plurality of thermal vias formed in the resin layer adjacent to the heat sink, each of the thermal vias being formed with conductive material filled in a via-hole formed in the resin layer, and the thermal vias providing parallel thermal connections between the heat sink and one of the embedded conductors that is electrically isolated from an electric circuit formed in the integrated thermoplastic resin body.

12. The multi-layer circuit board in claim 11, wherein the embedded conductor thermally connected with the heat sink is electrically isolated from the embedded conductors in the same layer.

13. The multi-layer circuit board in claim 7, further comprising:

a heat sink bonded to the integrated thermoplastic resin body and located on a side surface that is opposite to the electrodes; and a plurality of thermal vias respectively formed in a plurality of resin layers succeedingly layered to the heat sink, each of the thermal vias being formed with conductive material filled in a via-hole formed in the resin layer, one of the thermal vias providing a thermal connection between the heat sink and a first one of the embedded conductors, which is electrically isolated from an electric circuit formed in the integrated thermoplastic resin body, and another one of the thermal vias providing a thermal connection between the first one of the embedded conductors and a second one of the embedded conductors, wherein the second one of the embedded conductors is electrically isolated from the electric circuit formed in the integrated thermoplastic resin body.

14. The multi-layer circuit board in claim 13, wherein the embedded conductors that are thermally connected with the heat sink are electrically isolated from other embedded conductors in the same layer.

* * * * *